US011127802B2

(12) United States Patent
Lim et al.

(10) Patent No.: US 11,127,802 B2
(45) Date of Patent: Sep. 21, 2021

(54) ELECTROLUMINESCENCE DISPLAY

(71) Applicant: LG Display Co., Ltd., Seoul (KR)

(72) Inventors: Yusok Lim, Paju-si (KR); Moungo Kim, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/689,452

(22) Filed: Nov. 20, 2019

(65) Prior Publication Data
US 2020/0185476 A1 Jun. 11, 2020

(30) Foreign Application Priority Data
Dec. 7, 2018 (KR) .......................... 10-2018-0157043

(51) Int. Cl.
H01L 27/32 (2006.01)
G09G 3/20 (2006.01)
G09G 3/3275 (2016.01)
H01L 51/52 (2006.01)
H01L 27/12 (2006.01)

(52) U.S. Cl.
CPC ....... H01L 27/3248 (2013.01); G09G 3/2003 (2013.01); G09G 3/3275 (2013.01); H01L 27/3211 (2013.01); H01L 27/3262 (2013.01); H01L 27/3276 (2013.01); H01L 51/5209 (2013.01); G09G 2320/0233 (2013.01); H01L 27/1214 (2013.01)

(58) Field of Classification Search
CPC ............. H01L 27/3262; H01L 27/3276; H01L 27/3248; H01L 27/3211; H01L 51/5209; G09G 2300/0452; G09G 3/3233; G09G 3/2003
See application file for complete search history.

(56) References Cited

U.S. PATENT DOCUMENTS

| 2005/0264498 | A1* | 12/2005 | Asano | ...................... G09G 3/30 345/76 |
| 2010/0128160 | A1* | 5/2010 | Maru | .................... G09G 3/3233 348/333.01 |
| 2015/0054811 | A1* | 2/2015 | Azizi | .................... G06F 1/3265 345/211 |

* cited by examiner

Primary Examiner — Kent W Chang
Assistant Examiner — Scott Au
(74) Attorney, Agent, or Firm — Seed IP Law Group LLP

(57) ABSTRACT

An electroluminescence display comprises transistor arrays, OLEDs, and power source lines. The transistor arrays are arranged in a first direction and a second direction intersecting the first direction. The OLEDs are electrically connected to the transistor arrays, and emit first, second and third colors. The power source lines apply power source voltage to the transistor arrays. The transistor arrays are disposed adjacently in the first direction to share one power source line positioned between the transistor arrays, and include a transistor array of an A type and a transistor array of a B type symmetrical to each other with respect to a reference line extended in the second direction. All the OLEDs emitting a light of any one of the first to third colors are connected to the transistor array of the A type. All the OLEDs emitting another of the first to third colors are connected to the transistor array of the B type.

15 Claims, 14 Drawing Sheets

ELECTROLUMINESCENCE DISPLAY

CROSS-REFERENCE TO RELATED APPLICATION

This application claims the priority benefit of Korean Patent Application No. 10-2018-0157043 filed on Dec. 7, 2018, which is incorporated herein by reference for all purposes as if fully set forth herein.

BACKGROUND

Technical Field

The present disclosure relates to an electroluminescence display.

Description of the Related Art

Various display devices capable of reducing weight and volume, that is, disadvantages of the cathode ray tube, are developed. Such display devices may be implemented as a liquid crystal display (LCD), a field emission display (FED), a plasma display panel (PDP), an electroluminescence display, etc.

Among these display devices, the electroluminescence display device is divided into an inorganic light emitting diode display and an organic light emitting diode (OLED) display depending on the material of the light emitting layer. The OLED display is a self-emissive display device that emits light by exciting an organic compound, and has advantages in that the display can have light weight and can be made thin because it does not require a backlight used in the LCD and that the process can be simplified. Furthermore, the OLED display can be fabricated at low temperature, and is widely used because it has a high response speed of 1 ms or less and has characteristics, such as low consumption power, a wide viewing angle, and high contrast.

The OLED display includes an organic light emitting diode (OLED) for changing electrical energy into light energy. The OLED includes an anode, a cathode, and an organic emission layer positioned therebetween. In the OLED display, holes and electrons injected from the anode and the cathode, respectively, are combined in the emission layer to form excitons. The formed excitons drop from an excited state to a ground state, thus emitting and displaying an image.

An organic light-emitting display may include a transistor array for driving pixels having OLEDs. The transistor array may be configured with a plurality of signal lines and electrodes disposed between at least one insulating layer interposed therebetween.

BRIEF SUMMARY

A failure in which a specific layer is shifted in one direction due to a process deviation in a process of forming a transistor array may occur. In this case, an electrical characteristic of pixels, such as that parasitic capacitance within a pixel is changed, may be different, and thus poor picture quality may occur, which is problematic. The present disclosure provides an electroluminescence display having a minimum brightness deviation or less brightness deviation between subpixels attributable to a change in the electrical characteristic.

The present disclosure provides an electroluminescence display includes transistor arrays, OLEDs, and power source lines. The transistor arrays are arranged in a first direction and a second direction intersecting the first direction. The OLEDs are electrically connected to the transistor arrays, and emit lights of first, second and third colors. The power source lines apply power source voltages to the transistor arrays. The transistor arrays are disposed adjacently in the first direction to share one power source line positioned between the transistor arrays, and include a transistor array of an A type and a transistor array of a B type symmetrical to each other with respect to a reference line extended in the second direction. All the OLEDs emitting a light of any one of the first to third colors are connected to the transistor array of the A type. All the OLEDs emitting another of the first to third colors are connected to the transistor array of the B type.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
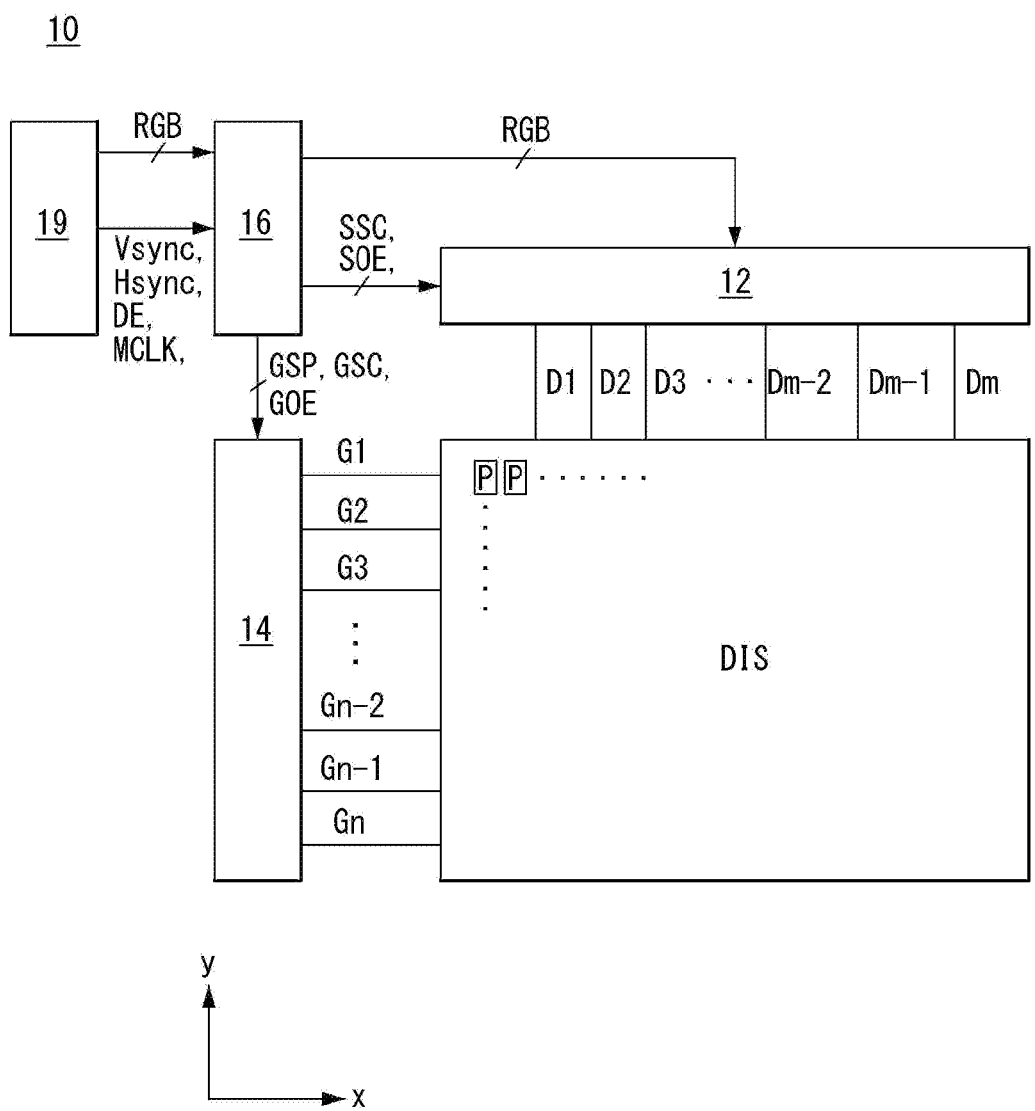
FIG. 1 is a block diagram schematically showing an organic light-emitting display.

Hereinafter, various embodiments of the present disclosure are described with reference to the accompanying drawings. Throughout the specification, the same reference numeral substantially denotes the same element. In the following description, a detailed description of known technology or element related to the present disclosure will be omitted if it is deemed to make the gist of the present disclosure unnecessarily vague. In describing several embodiments, the same element is representatively described at the introductory part of this specification, and may be omitted in other embodiments.

Terms including ordinal numbers, such as the first and the second, may be used to describe various elements, but the elements are not limited by the terms. The terms are used to only distinguish one element from the other element.

Hereinafter, an example in which an electroluminescence display is implemented as an organic light-emitting display including an organic light-emitting substance is described, for convenience of description. The technical spirit of the present disclosure is not limited to an organic light-emitting display and may be applied to an inorganic light-emitting display including an inorganic light-emitting substance.

Figure 2:
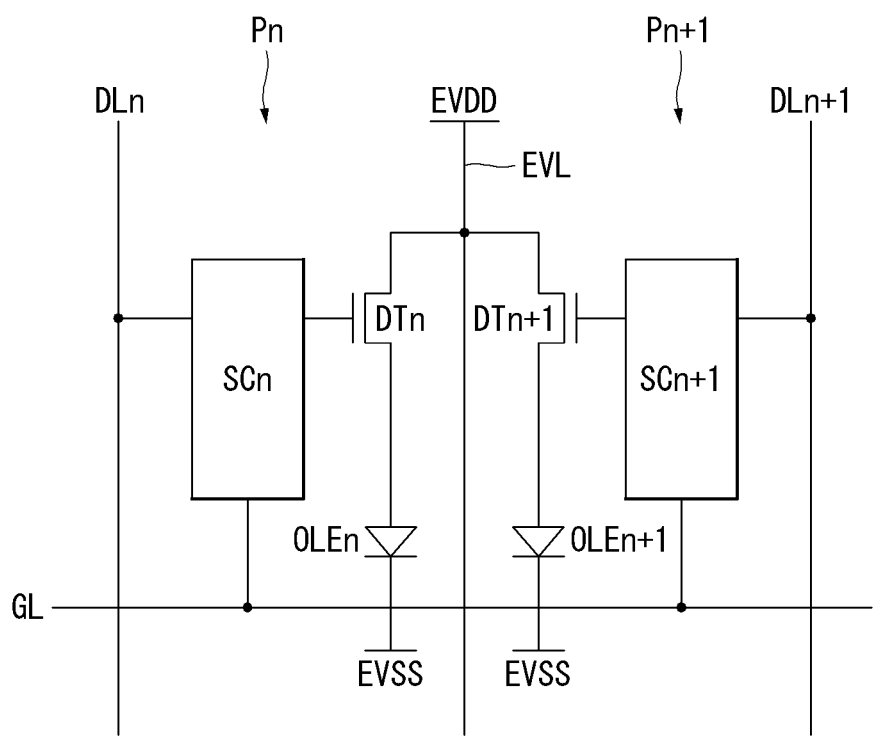
FIG. 2 is a circuit diagram schematically showing subpixels adjacent in a first direction.

FIG. 1 is a block diagram schematically showing an organic light-emitting display. FIG. 2 is a circuit diagram schematically showing subpixels adjacent in a first direction.

Referring to FIG. 1, the organic light-emitting display 10 according to one or more embodiments of the present disclosure includes a display driver circuit and a display panel DIS.

The display driver circuit includes a data driver circuit 12, a gate driver circuit 14, and a timing controller 16 and writes (supplies) a video data voltage of an input video in (to) subpixels of the display panel DIS. The data driver circuit 12 generates a data voltage by converting digital video data (RGB), received from the timing controller 16, into an analog gamma compensation voltage. The data voltage output by the data driver circuit 12 is supplied to data lines D1~Dm. The gate driver circuit 14 selects subpixels of the display panel DIS in which a data voltage is written by sequentially supplying gate lines G1~Gn with a gate signal synchronized with the data voltage.

The timing controller 16 receives timing signals, such as a vertical sync signal Vsync, a horizontal sync signal Hsync, a data enable signal DE, and a main clock MCLK, from a host system 19, and synchronizes operating timing of the data driver circuit 12 and the gate driver circuit 14. A data timing control signal for controlling the data driver circuit 12 includes a source sampling clock (SSC), a source output enable (SOE) signal, etc. A gate timing control signal for controlling the gate driver circuit 14 includes a gate start pulse GSP, a gate shift clock GSC, a gate output enable signal GOE, etc.

The host system 19 may be implemented as any one of a television system, a set-top box, a navigation system, a DVD player, a Blu-ray player, a personal computer (PC), a home theater system, or a phone system. The host system 19 includes a system on chip (SoC) having a scaler embedded therein, and converts the digital video data (RGB) of an input video into a format suitable for being displayed in the display panel DIS. The host system 19 transmits the timing signals (Vsync, Hsync, DE, MCLK) to the timing controller 16 along with the digital video data.

The display panel DIS includes a plurality of subpixels arranged in a first direction (e.g., X-axis direction) and a second direction (e.g., Y-axis direction). The subpixels may be defined by the cross structures of the data lines D1~Dm (m is a positive integer) and the gate lines G1~Gn (n is a positive integer), but are not limited thereto. Each of the subpixels includes an organic light emitting diode (OLED), that is, a self-emissive element.

Referring further to FIG. 2, each of the subpixels includes an OLED, a driving thin film transistor (TFT) (DTn, DTn+1) for controlling the amount of current flowing into the OLED (OLEn, OLEn+1), and a programming unit (SCn, SCn+1) for setting a gate-source voltage of the driving TFT (DTn, DTn+1).

The programming unit (SCn, SCn+1) may include at least one switch TFT and at least one storage capacitor. The switch TFT is turned on in response to a gate signal from a gate line GL, thus applying a data voltage from a data line (DLn, DLn+1) to one-side electrode of the storage capacitor. The driving TFT (DTn, DTn+1) adjusts the amount of emission of the OLED by controlling the amount of current, supplied to the OLED, based on the amount of a voltage charged in the storage capacitor. The amount of emission of the OLED is proportional to the amount of current supplied by the driving TFT (DTn, DTn+1). Such a subpixel is connected to a high potential voltage source EVDD and a low potential voltage source EVSS, and is supplied with a high potential power source voltage and a low potential power source voltage from a power source generator. TFTs configuring a subpixel may be implemented in a p type or may be implemented in an n type. Furthermore, the semiconductor layer of TFTs configuring a subpixel may include amorphous silicon, polysilicon, or oxide. Hereinafter, an example in which the semiconductor layer includes oxide is described. The OLED (OLEn, OLEn+1) includes an anode ANO, a cathode CAT, and an organic compound layer interposed between the anode ANO and the cathode CAT. The anode ANO is connected to a driving TFT DT.

In each of the subpixels Pn and Pn+1 of the organic light-emitting display, the electrical characteristics of the subpixels Pn and Pn+1, such as the threshold voltage Vth of the driving TFT (DTn, DTn+1), the electron mobility (μ) of the driving TFT (DTn, DTn+1), a temperature deviation of the driving TFT (DTn, DTn+1), and the threshold voltage Vth of the OLED (OLEn, OLEn+1), are factors to determine the driving current of the driving TFT (DTn, DTn+1), and thus they need to be the same in all the subpixels Pn and Pn+1. However, an electrical characteristic may be different between the subpixels Pn and Pn+1 due to various causes, such as a process deviation of a transistor array and a change with time. Such a deviation in the electrical characteristic of the subpixels Pn and Pn+1 may result in the degradation of picture quality (or, image quality) and a reduction in lifespan. In order to reduce the degradation of the subpixels Pn and Pn+1 and to extend the lifespan, an internal compensation circuit or an external compensation circuit may be applied.

The internal compensation circuit is positioned in each of the subpixels Pn and Pn+1, and compensates for a gate voltage of the driving TFT (DTn, DTn+1) as much as the threshold voltage of the driving TFT (DTn, DTn+1) by sampling the threshold voltage.

The external compensation circuit compensates for an electrical characteristic deviation and deterioration between the subpixels Pn and Pn+1 by sensing an electrical characteristic of the subpixels Pn and Pn+1 through a sensing path connected to the subpixels Pn and Pn+1 and modulating the pixel data Vdata of an input video based on a result of the sensing. The external compensation circuit may sense one or more of the threshold voltage Vth of the driving TFT (DTn, DTn+1), the electron mobility (μ) of the driving element DT, a temperature deviation of the driving element DT, or the threshold voltage Vth of the OLED (OLEn, OLEn+1) in each of the subpixels Pn and Pn+1, and may transmit a result of the sensing to the timing controller 16.

The subpixels Pn and Pn+1 adjacent in the first direction share one high potential power source line EVL crossing between the subpixels. The high potential power source line EVL may extend in the second direction. For example, as shown in FIG. 2, the n-th subpixel Pn and the (n+1)-th subpixel Pn+1 may be disposed adjacently in the first direction. The high potential power source line EVL may be positioned between the n-th subpixel Pn and the (n+1)-th subpixel Pn+1k, and may supply a high potential power source voltage to the n-th subpixel Pn and the (n+1)-th subpixel Pn+1. The organic light-emitting display according to one or more embodiments of the present disclosure can reduce the number of high potential power source lines EVL compared to a conventional technology because the subpixels Pn and Pn+1 adjacent in the first direction share the high potential power source line EVL. Accordingly, there is an advantage in that a high-resolution display can be implemented because the interval between the adjacent subpixels Pn and Pn+1 can be reduced.

Comparison Example

Figure 3:
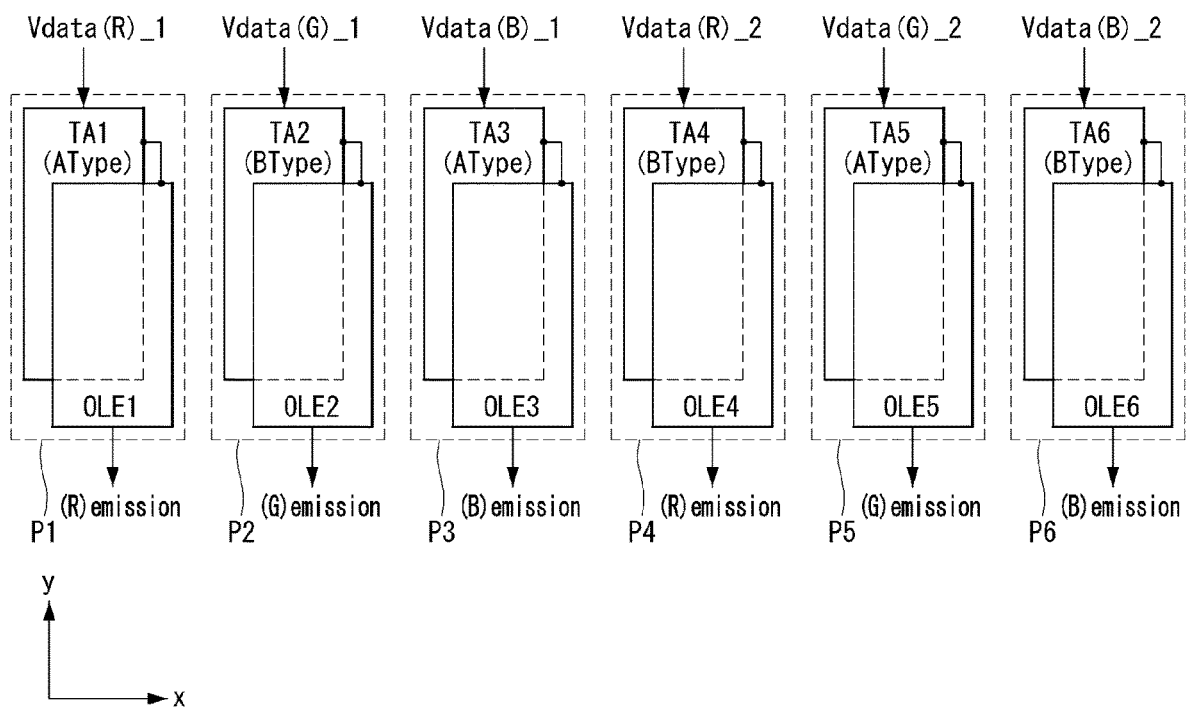
FIGS. 3 and 4 schematically show an organic light-emitting display according to a comparison example.
Figure 4:
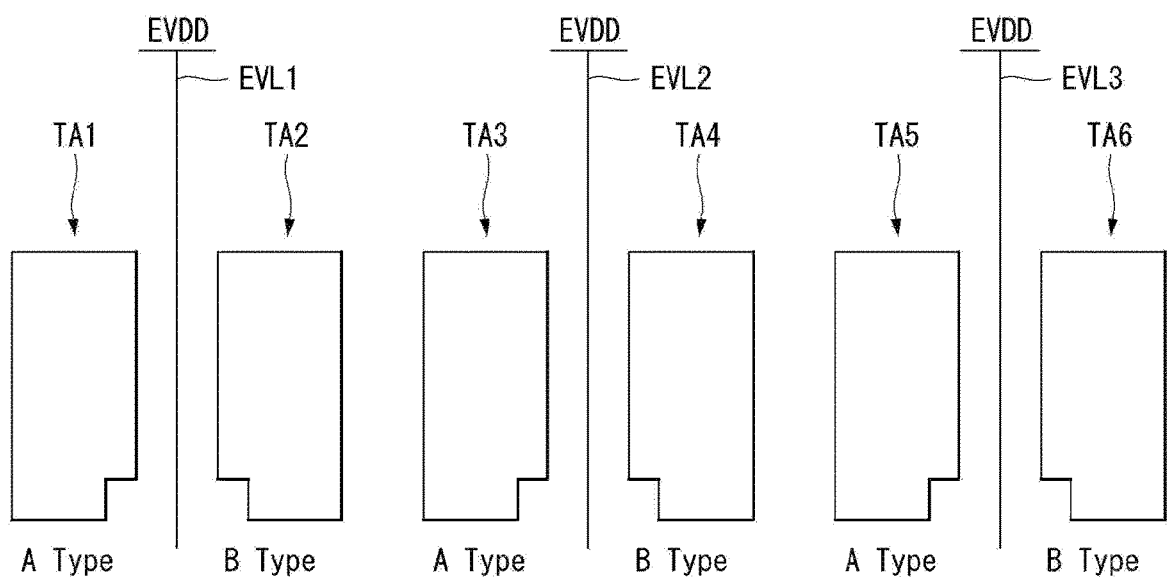

FIGS. 3 and 4 schematically show an organic light-emitting display according to a comparison example.

Referring to FIGS. 3 and 4, the organic light-emitting display according to the comparison example includes a plurality of subpixels arranged in the first direction and the second direction. Subpixels adjacent in the first direction share a high potential power source line EVL. The high potential power source line EVL may extend in the second direction.

For example, the subpixels include a first subpixel P1, a second subpixel P2, a third subpixel P3, a fourth subpixel P4, a fifth subpixel P5, and a sixth subpixel P6 sequentially arranged in the first direction.

Each of the subpixels P includes a transistor array TA and an OLED OLE. The transistor array TA may include the programming unit SC and the driving TFT DT shown in FIG. 2.

For example, the first subpixel P1 includes a first transistor array TA1 and a first OLED OLE1. The second subpixel P2 includes a second transistor array TA2 and a second OLED OLE2. The third subpixel P3 includes a third transistor array TA3 and a third OLED OLE3. The fourth subpixel P4 includes a fourth transistor array TA4 and a fourth OLED OLE4. The fifth subpixel P5 includes a fifth transistor array TA5 and a fifth OLED OLE5. The sixth subpixel P6 includes a sixth transistor array TA6 and a sixth OLED OLE6.

The structures of the transistor arrays TA adjacent in the first direction have a line symmetry relation with respect to a virtual reference line extended in the second direction. For example, the first transistor array TA1 and the second transistor array TA2 have plane structures symmetrical to each other with respect to a first high potential power source line EVL1. The third transistor array TA3 and the fourth transistor array TA4 have plane structures symmetrical to each other with respect to a second high potential power source line EVL2. The fifth transistor array TA5 and the sixth transistor array TA6 have plane structures symmetrical to each other with respect to a third high potential power source line EVL3.

Accordingly, the first transistor array TA1, the third transistor array TA3, and the fifth transistor array TA5 have an A type plane structure. The second transistor array TA2, the fourth transistor array TA4, and the sixth transistor array TA6 have a B type plane structure symmetrical to the A type plane structure. That is, the A type transistor array and the B type transistor array may be sequentially arranged alternately in the first direction.

The first transistor array TA1 and the second transistor array TA2 share the first high potential power source line EVL1 positioned between the first transistor array TA1 and the second transistor array TA2. The third transistor array TA3 and the fourth transistor array TA4 share the second high potential power source line EVL2 positioned between the third transistor array TA3 and the fourth transistor array TA4. The fifth transistor array TA5 and the sixth transistor array TA6 share the third high potential power source line EVL3 positioned between the fifth transistor array TA5 and the sixth transistor array TA6.

First and fourth OLEDs OLE1 and OLE4 emit light of a first color. Second and fifth OLEDs OLE2 and OLE5 emit light of a second color. Third and sixth OLEDs OLE3 and OLE6 emit light of a third color. The first color may be assigned as red (R), the second color may be assigned as green (G), and the third color may be assigned as blue (B), but are not limited thereto.

In the comparison example, the OLEDs emitting the light of the first color may be alternately matched with the A type transistor arrays and the B type transistor arrays. The OLEDs emitting the light of the second color may be alternately matched with the B type transistor arrays TA2 and the A type transistor arrays TA5. The OLEDs emitting the light of the third color may be alternately matched with the A type transistor arrays and the B type transistor arrays.

For example, as shown in FIG. 3, the first OLED OLE1 emitting the light of the first color may be electrically connected to the first transistor array TA1 of the A type, and the fourth OLED OLE4 emitting the light of the first color may be electrically connected to the fourth transistor array TA4 of the B type. The second OLED OLE2 emitting the light of the second color may be electrically connected to the second transistor array TA2 of the B type, and the fifth OLED OLE5 emitting the light of the second color may be electrically connected to the fifth transistor array TA5 of the A type. The third OLED OLE3 emitting the light of the third color may be electrically connected to the third transistor array TA3 of the A type, and the sixth OLED OLE6 emitting the light of the third color may be electrically connected to the sixth transistor array TA6 of the B type.

In this case, the first transistor array TA1 is supplied with a first data voltage Vdata(R)_1, and turns on the first OLED OLE1 electrically connected thereto in response to a corresponding gate signal. The second transistor array TA2 is supplied with a second data voltage Vdata(G)_1, and turns on the second OLED OLE2 electrically connected thereto in response to a corresponding gate signal. The third transistor array TA3 is supplied with a third data voltage Vdata(B)_1, and turns on the third OLED OLE3 electrically connected thereto in response to a corresponding gate signal.

The fourth transistor array TA4 is supplied with a fourth data voltage Vdata(R)_2, and turns on the fourth OLED OLE4 electrically connected thereto in response to a corresponding gate signal. The fifth transistor array TA5 is supplied with a fifth data voltage Vdata(G)_2, and turns on the fifth OLED OLE5 electrically connected thereto in response to a corresponding gate signal. The sixth transistor array TA6 is supplied with a sixth data voltage Vdata(B)_2, and turns on the sixth OLED OLE6 electrically connected thereto in response to a corresponding gate signal.

Figure 5:
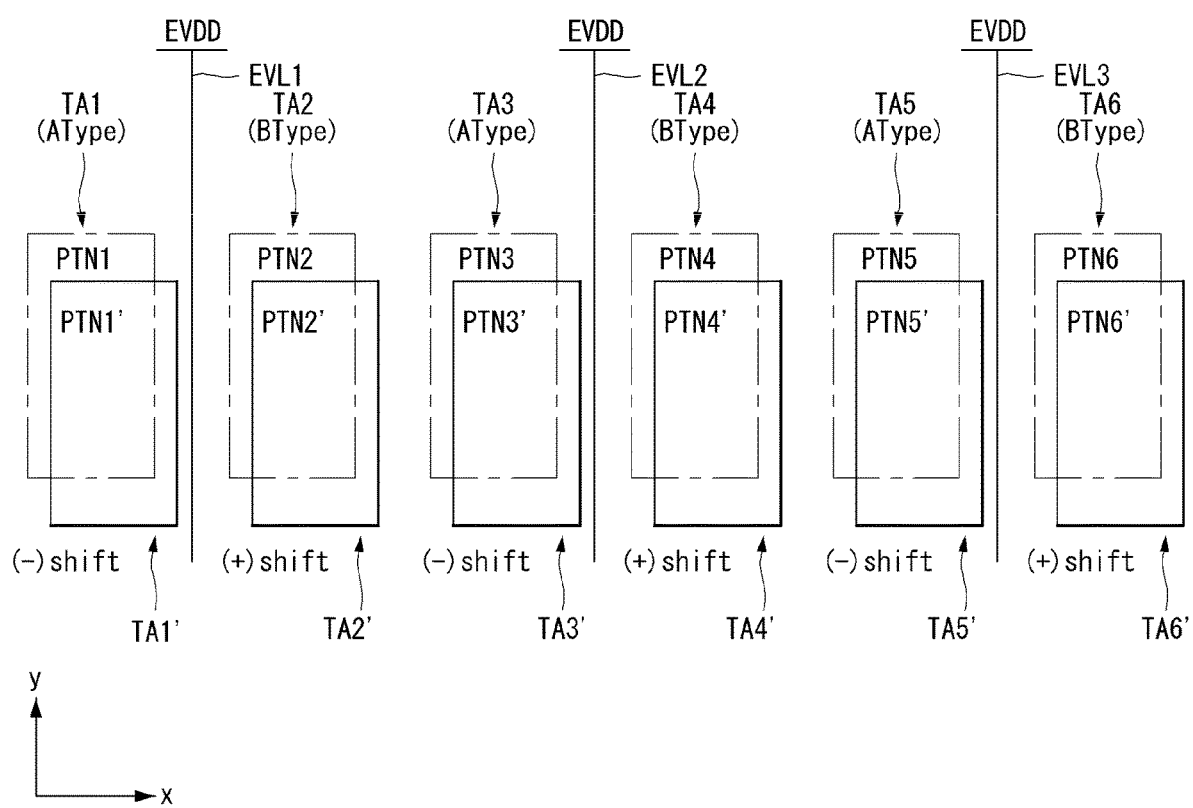
FIG. 5 is a diagram for illustrating problems of the organic light-emitting display according to the comparison example.

FIG. 5 is a diagram for illustrating problems of the organic light-emitting display according to the comparison example.

A failure in which a specific layer is shifted in one direction due to a process deviation may occur in a process of forming a transistor array. In this case, an electrical characteristics of subpixels, such as that parasitic capacitance within a subpixel is changed, may be different.

More specifically, referring to FIG. 5, dotted lines schematically show the shape of patterns PTN1, PTN2, PTN3, PTN4, PTN5, and PTN6 on a plane if a specific layer has been in place. Solid lines schematically show the shape of patterns PTN1', PTN2', PTN3', PTN4', PTN5', and PTN6' on a plane if a specific layer has been shifted due to a process deviation. The specific layer may be at least one of layers configuring a transistor, for example, a gate electrode, a source/drain electrode or a semiconductor layer, but is not limited thereto.

If a specific layer has been shifted in one direction, the patterns PTN1', PTN3', and PTN5' of the A type are shifted in a (−) direction that becomes close to a high potential power source line EVL with respect to the high potential power source line EVL, and the patterns PTN2', PTN4', and PTN6' of the B type are shifted in a (+) direction that becomes distant from the high potential power source line EVL. Accordingly, in the A type transistor arrays TA1, TA3, and TA5 and the B type transistor arrays TA2, TA4, and TA6, a difference between the changes of electrical characteristics is great. For example, if a specific layer is shifted, in the A type transistor arrays TA1, TA3, and TA5 and the B type transistor arrays TA2, TA4, and TA6, a difference of the overlap area between the specific layer and a data line occurs. Parasitic capacitance may be different due to such a difference.

Due to the above-described structural characteristic, when the same data voltage Vdata(R) is applied, driving currents flowing into the driving transistor of the first transistor array TA1 of the A type and the driving transistor of the fourth transistor array TA4 of the B type may be greatly different. Accordingly, poor picture quality attributable to a brightness deviation between subpixels that emit the first color may be caused because brightness implemented in the first OLED OLE1 and brightness implemented in the fourth OLED OLE4 are different due to a deviation between the driving currents.

Furthermore, when the same data voltage Vdata(G) is applied, driving currents flowing into the driving transistor of the second transistor array TA2 of the B type and the driving transistor of the fifth transistor array TA5 of the A type may be greatly different. Accordingly, poor picture quality attributable to a brightness deviation between subpixels that emit the second color may be caused between brightness implemented in the second OLED OLE2 and brightness implemented in the fifth OLED OLE5 are different due to a deviation between the driving currents.

Furthermore, when the same data voltage Vdata(B) is applied, driving currents flowing into the driving transistor of the third transistor array TA3 of the A type and the driving transistor of the sixth transistor array TA6 of the B type may be greatly different. Accordingly, poor picture quality attributable to a brightness deviation between subpixels that emit the third color may be caused because brightness implemented in the third OLED OLE3 and brightness implemented in the sixth OLED OLE6 are different due to a deviation between the driving currents.

That is, color distortion attributable to a brightness deviation between subpixels that displays the same color is recognized to a user as a stain, which is problematic because it significantly degrades display quality.

Figure 6:
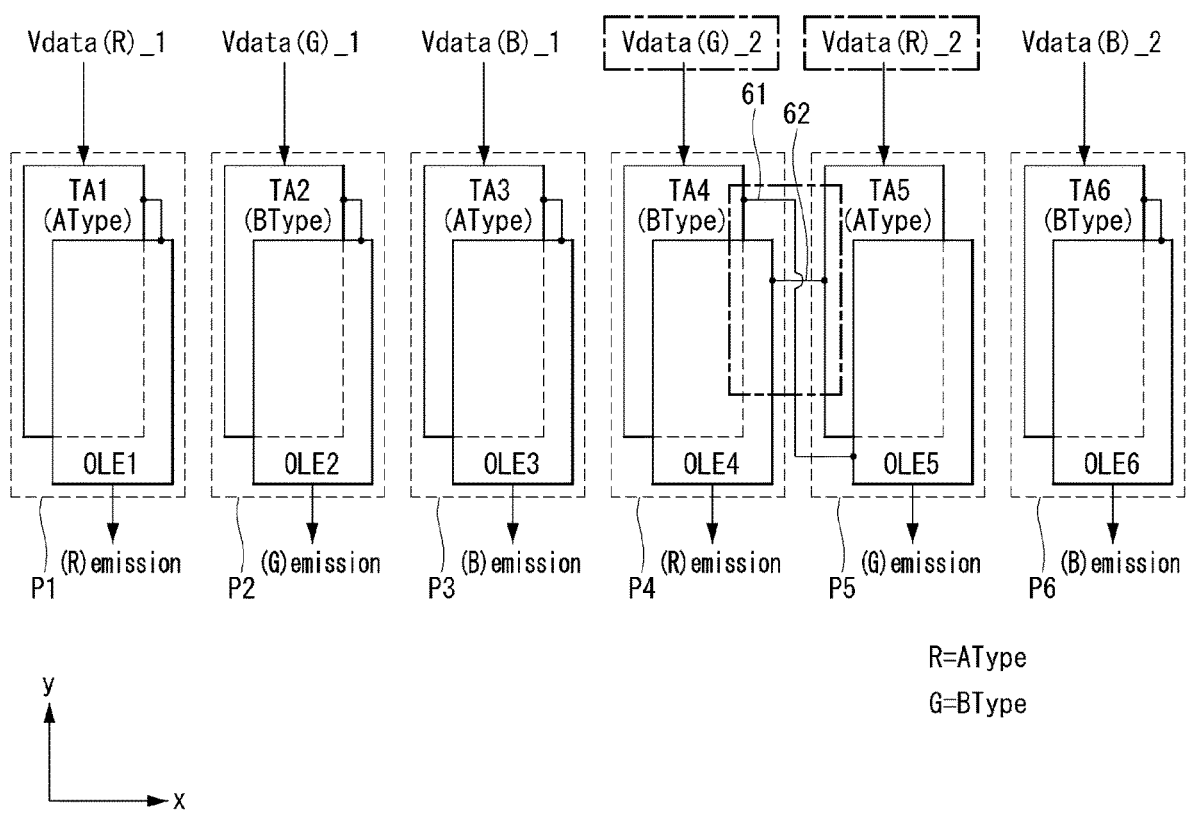
FIGS. 6 and 7 illustrate an organic light-emitting display according to one or more embodiments of the present disclosure.
Figure 7:
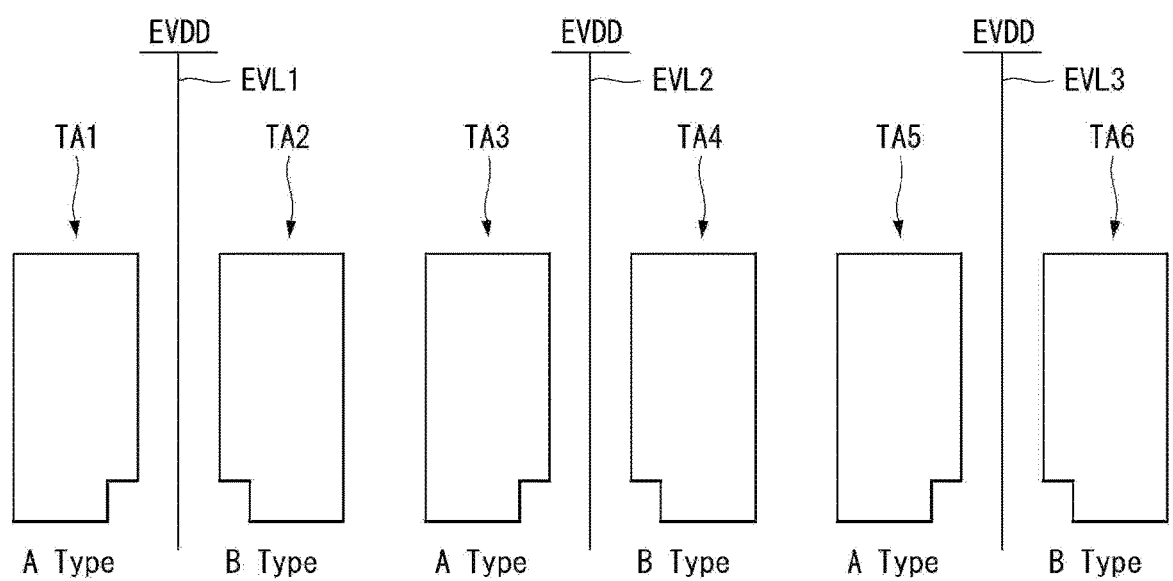
Figure 7:
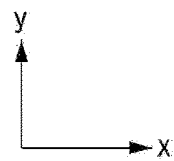

FIGS. 6 and 7 illustrate an organic light-emitting display according to one or more embodiments of the present disclosure.

Referring to FIGS. 6 and 7, the organic light-emitting display includes a plurality of subpixels arranged in a first direction and a second direction. Subpixels adjacent in the first direction share a high potential power source line EVL. The high potential power source line EVL may extend in the second direction.

For example, the subpixels include a first subpixel P1, a second subpixel P2, a third subpixel P3, a fourth subpixel P4, a fifth subpixel P5, and a sixth subpixel P6 sequentially arranged in the first direction.

Each of the subpixels P includes a transistor array TA and an OLED OLE. The transistor array TA may include the programming unit SC and the driving TFT DT shown in FIG. 2.

For example, the first subpixel P1 includes a first transistor array TA1 and a first OLED OLE1. The second subpixel P2 includes a second transistor array TA2 and a second OLED OLE2. The third subpixel P3 includes a third transistor array TA3 and a third OLED OLE3. The fourth subpixel P4 includes a fourth transistor array TA4 and a fourth OLED OLE4. The fifth subpixel P5 includes a fifth transistor array TA5 and a fifth OLED OLE5. The sixth subpixel P6 includes a sixth transistor array TA6 and a sixth OLED OLE6.

The structures of transistor arrays adjacent in the first direction have a line symmetry relation with respect to a virtual reference line extended in the second direction. For example, the first transistor array TA1 and the second transistor array TA2 have plane structures symmetrical to each other with respect to a first high potential power source line EVL1. The third transistor array TA3 and the fourth transistor array TA4 have plane structures symmetrical to each other with respect to a second high potential power source line EVL2. The fifth transistor array TA5 and the sixth transistor array TA6 have plane structures symmetrical to each other with respect to a third high potential power source line EVL3.

Accordingly, the first transistor array TA1, the third transistor array TA3, and the fifth transistor array TA5 have an A type plane structure. The second transistor array TA2, the fourth transistor array TA4, and the sixth transistor array TA6 have a B type plane structure symmetrical to the A type plane structure. That is, the A type transistor array and the B type transistor array may be sequentially arranged alternately in the first direction.

The first transistor array TA1 and the second transistor array TA2 share a first high potential power source line EVL1 positioned between the first transistor array TA1 and the second transistor array TA2. The third transistor array TA3 and the fourth transistor array TA4 share a second high potential power source line EVL2 positioned between the third transistor array TA3 and the fourth transistor array TA4. The fifth transistor array TA5 and the sixth transistor array TA6 share a third high potential power source line EVL3 positioned between the fifth transistor array TA5 and the sixth transistor array TA6.

The first and the fourth OLEDs OLE1 and OLE4 emit light of a first color. The second and the fifth OLEDs OLE2 and OLE5 emit light of a second color. The third and the sixth OLEDs OLE3 and OLE6 emit light of a third color. The first color may be assigned as red (R), the second color may be assigned as green (G), and the third color may be assigned as blue (B), but are not limited thereto.

In one or more embodiments of the present disclosure, OLEDs emitting the light of the first color may be matched with the A type transistor arrays, and OLEDs emitting the light of the second color may be matched with the B type transistor arrays.

For example, as shown in FIG. 6, the first OLED OLE1 emitting the light of the first color may be electrically connected to the first transistor array TA1 of the A type, and the fourth OLED OLE4 emitting the light of the first color may be electrically connected to the fifth transistor array TA5 of the A type. The second OLED OLE2 emitting the light of the second color may be electrically connected to the second transistor array TA2 of the B type, and the fifth OLED OLE5 emitting the light of the second color may be electrically connected to the fourth transistor array TA4 of the B type. In this case, the third OLED OLE3 emitting the light of the third color may be electrically connected to the third transistor array TA3 of the A type, and the sixth OLED OLE6 emitting the light of the third color may be connected to the sixth transistor array TA6 of the B type.

In this case, the first transistor array TA1 is supplied with a first data voltage Vdata(R)_1, and turns on the first OLED OLE1 electrically connected thereto in response to a corresponding gate signal. The second transistor array TA2 is supplied with a second data voltage Vdata(G)_1, and turns on the second OLED OLE2 electrically connected thereto in response to a corresponding gate signal. The third transistor array TA3 is supplied with a third data voltage Vdata(B)_1, and turns on the third OLED OLE3 electrically connected thereto in response to a corresponding gate signal.

The fourth transistor array TA4 is supplied with a fifth data voltage Vdata(G)_2, and turns on the fifth OLED OLE5 electrically connected thereto through the first auxiliary signal line 61 in response to a corresponding gate signal. The fifth transistor array TA5 is supplied with a fourth data voltage Vdata(R)_2, and turns on the fourth OLED OLE4 electrically connected thereto through the second auxiliary signal line 62 in response to a corresponding gate signal. The sixth transistor array TA6 is supplied with a sixth data voltage Vdata(B)_2, and turns on the sixth OLED OLE6 electrically connected thereto in response to a corresponding gate signal.

In one or more embodiments of the present disclosure, unlike in the comparison example, both the OLEDs OLE1 and OLE4 emitting the light of the first color are connected to the transistor arrays TA1 and TA5 of the same A type, respectively. Accordingly, although a specific layer is shifted in one direction due to a process deviation, a brightness deviation between subpixels emitting the light of the first color can be reduced or minimized because a change in the electrical characteristics of the A type transistor arrays TA1 and TA5 connected to the OLEDs OLE1 and OLE4 emitting the light of the first color is substantially the same.

Furthermore, in one or more embodiments of the present disclosure, both the OLEDs OLE2 and OLE5 emitting the light of the second color are connected to the transistor arrays TA2 and TA4 of the same B type, respectively. Accordingly, although a specific layer is shifted in one direction due to a process deviation, a brightness deviation between subpixels emitting the light of the second color can be reduced or minimized because a change in the electrical characteristics of the B type transistor arrays connected to the OLEDs OLE2 and OLE5 emitting the second color is substantially the same.

The OLEDs OLE3 and OLE6 emitting the light of the third color are connected to the transistor arrays TA3 and TA6 of different types, respectively. Accordingly, if a specific layer is shifted in one direction, the above-described problem may occur. In order to reduce or minimize a failure attributable to the problem, the third color may be selected by taking into consideration a user's perception level. For example, the third color may be set as blue having a lower user perception level than red or green when a brightness deviation occurs.

Figure 8:
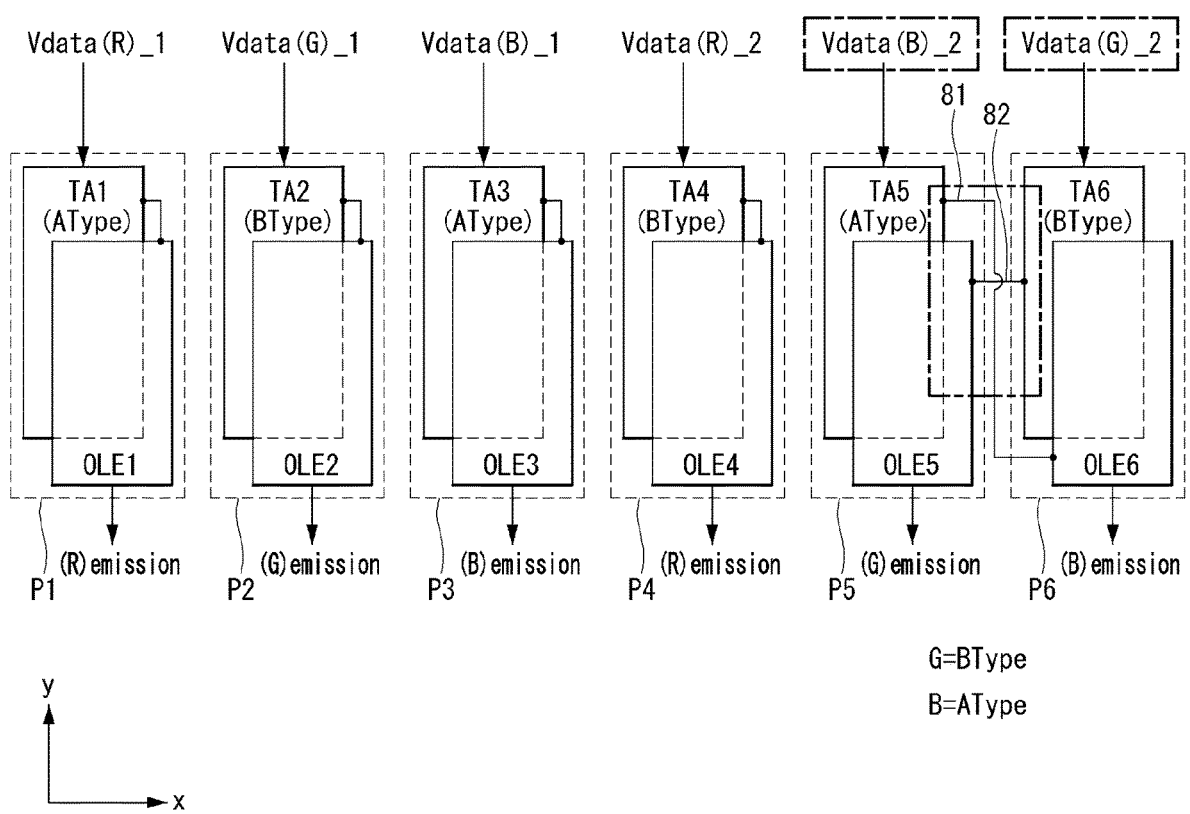
FIGS. 8 and 9 illustrate an organic light-emitting display according to one or more embodiments of the present disclosure.
Figure 9:
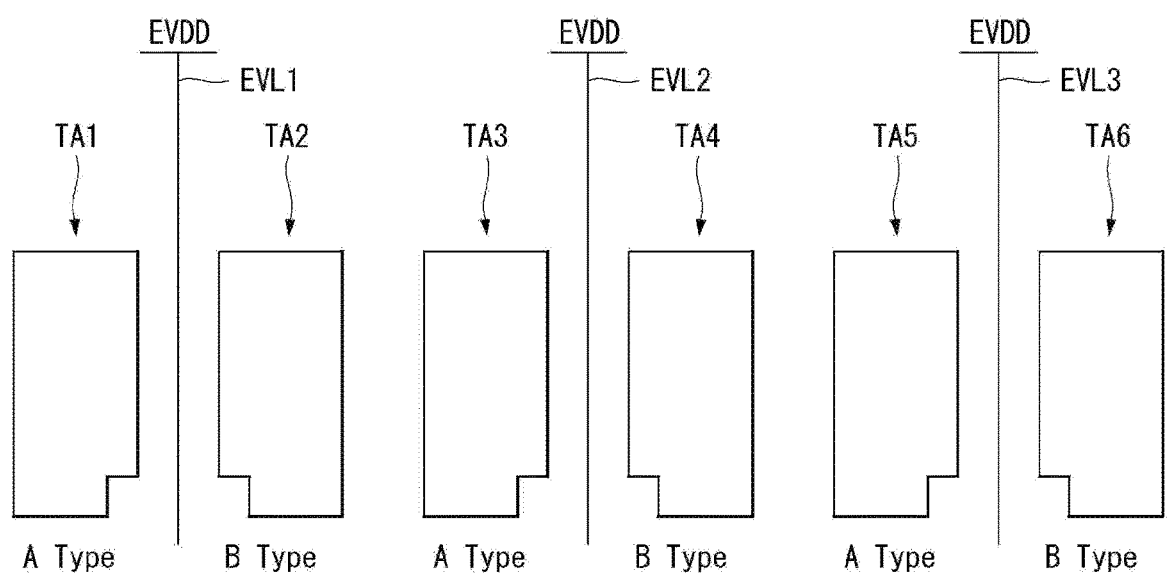

FIGS. 8 and 9 illustrate an organic light-emitting display according to one or more embodiments of the present disclosure.

Referring to FIGS. 8 and 9, the organic light-emitting display includes a plurality of subpixels arranged in a first direction and a second direction. Subpixels adjacent in the first direction share a high potential power source line EVL. The high potential power source line EVL may extend in the second direction.

For example, the subpixels include a first subpixel P1, a second subpixel P2, a third subpixel P3, a fourth subpixel P4, a fifth subpixel P5, a sixth subpixel P6 sequentially arranged in the first direction.

Each of the subpixels P includes a transistor array TA and an OLED OLE. The transistor array TA may include the programming unit SC and the driving TFT DT shown in FIG. 2.

For example, the first subpixel P1 includes a first transistor array TA1 and a first OLED OLE1. The second subpixel P2 includes a second transistor array TA2 and a second OLED OLE2. The third subpixel P3 includes a third transistor array TA3 and a third OLED OLE3. The fourth subpixel P4 includes a fourth transistor array TA4 and a fourth OLED OLE4. The fifth subpixel P5 includes a fifth transistor array TA5 and a fifth OLED OLE5. The sixth subpixel P6 includes a sixth transistor array TA6 and a sixth OLED OLE6.

The structures of transistor arrays adjacent in the first direction have a line symmetry relation with respect to a virtual reference line extended in the second direction. For example, the first transistor array TA1 and the second transistor array TA2 have plane structures symmetrical to each other with respect to a first high potential power source line EVL1. The third transistor array TA3 and the fourth transistor array TA4 have plane structures symmetrical to each other with respect to a second high potential power source line EVL2. The fifth transistor array TA5 and the sixth transistor array TA6 have plane structures symmetrical to each other with respect to a third high potential power source line EVL3.

Accordingly, the first transistor array TA1, the third transistor array TA3, and the fifth transistor array TA5 have an A type plane structure. The second transistor array TA2, the fourth transistor array TA4, and the sixth transistor array TA6 have a B type plane structure symmetrical to the A type plane structure. That is, the A type transistor array and the B type transistor array may be sequentially arranged alternately in the first direction.

The first transistor array TA1 and the second transistor array TA2 share a first high potential power source line EVL1 positioned between the first transistor array TA1 and the second transistor array TA2. The third transistor array TA3 and the fourth transistor array TA4 share a second high potential power source line EVL2 positioned between the third transistor array TA3 and the fourth transistor array TA4. The fifth transistor array TA5 and the sixth transistor array TA6 share a third high potential power source line EVL3 positioned between the fifth transistor array TA5 and the sixth transistor array TA6.

The first and the fourth OLEDs OLE1 and OLE4 emit light of a first color. The second and the fifth OLEDs OLE2 and OLE5 emit light of a second color. The third and the sixth OLEDs OLE3 and OLE6 emit light of a third color. The first color may be assigned as red (R), the second color may be assigned as green (G), and the third color may be assigned as blue (B), but are not limited thereto.

In one or more embodiments of the present disclosure, OLEDs emitting the light of the second color may be matched with the B type transistor arrays, and OLEDs emitting the light of the third color may be matched with the A type transistor arrays.

For example, as shown in FIG. 8, the second OLED OLE2 emitting the light of the second color may be electrically connected to the second transistor array TA2 of the B type, and the fifth OLED OLE5 emitting the light of the second color may be electrically connected to the sixth transistor array TA6 of the B type. The third OLED OLE3 emitting the light of the third color may be electrically connected to the third transistor array TA3 of the A type. The sixth OLED OLE6 emitting the light of the third color may be electrically connected to the fifth transistor array TA5 of the A type. In this case, the first OLED OLE1 emitting the light of the first color may be electrically connected to the first transistor array TA1 of the A type, and the fourth OLED OLE4 emitting the light of the first color may be electrically connected to the fourth transistor array TA4 of the B type.

In this case, the first transistor array TA1 is supplied with a first data voltage Vdata(R)_1, and turns on the first OLED OLE1 electrically connected thereto in response to a corresponding gate signal. The second transistor array TA2 is supplied with a second data voltage Vdata(G)_1, and turns on the second OLED OLE2 electrically connected thereto in response to a corresponding gate signal. The third transistor array TA3 is supplied with a third data voltage Vdata(B)_1, and turns on the third OLED OLE3 electrically connected thereto in response to a corresponding gate signal.

The fourth transistor array TA4 is supplied with a fourth data voltage Vdata(R)_2, and turns on the fourth OLED OLE4 electrically connected thereto in response to a corresponding gate signal. The fifth transistor array TA5 is supplied with a sixth data voltage Vdata(B)_2, and turns on the sixth OLED OLE6 electrically connected thereto through the first auxiliary signal line 81 in response to a corresponding gate signal. The sixth transistor array TA6 is supplied with a fifth data voltage Vdata(G)_2, and turns on the sixth OLED OLE6 electrically connected thereto through the second auxiliary signal line 82 in response to a corresponding gate signal.

In one of more embodiments of the present disclosure, unlike in the comparison example, both the OLEDs OLE2 and OLE5 emitting the light of the second color are connected to the transistor arrays TA2 and TA6 of the same B type, respectively. Accordingly, although a specific layer is shifted in one direction due to a process deviation, a brightness deviation between subpixels emitting the light of the second color can be reduced or minimized because a change in the electrical characteristics of the B type transistor arrays TA2 and TA6 connected to the OLEDs OLE2 and OLE5 emitting the second color is substantially the same.

Furthermore, in one or more embodiments of the present disclosure, both the OLEDs OLE3 and OLE6 emitting the light of the third color are connected to the transistor arrays TA3 and TA5 of the same A type, respectively. Accordingly, although a specific layer is shifted in one direction due to a process deviation, a brightness deviation between subpixels emitting the light of the third color can be reduced or minimized because a change in the electrical characteristics of the A type transistor arrays TA3 and TA5 connected to the OLEDs OLE3 and OLE6 emitting the third color is substantially the same.

Application Example

Hereinafter, a detailed application example of one or more embodiments of the present disclosure is described with reference to FIGS. 10 and 11. FIGS. 10A and 10B schematically show the structure of transistor arrays according to an application example of the present disclosure. FIGS. 11A and 11B schematically show connection relations between transistor arrays and OLEDs according to an application example of the present disclosure. FIG. 12 illustrates a modified example of a first electrode.

Figure 10A:
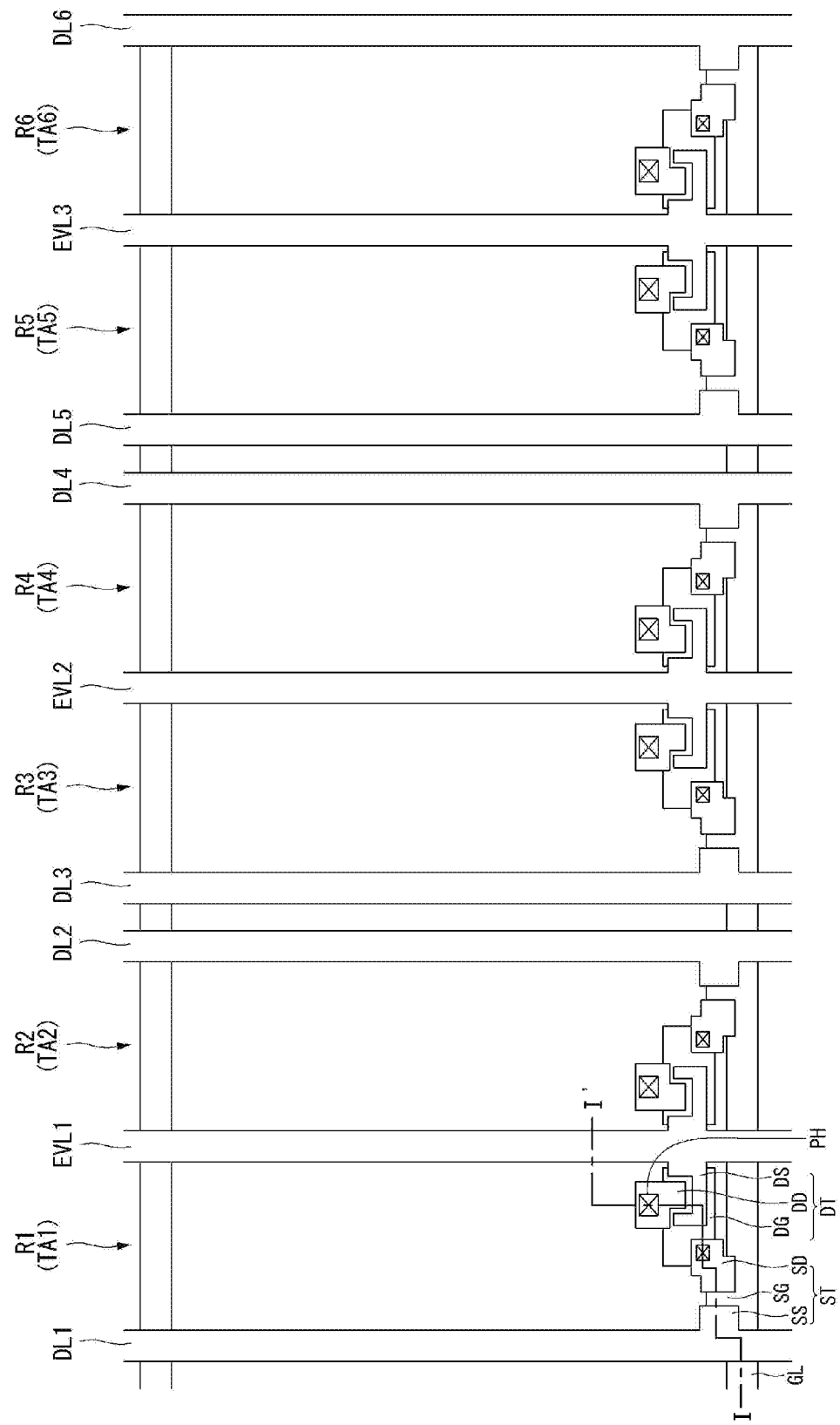
FIGS. 10A and 10B schematically show the structure of transistor arrays according to an application example of the present disclosure.
Figure 10B:
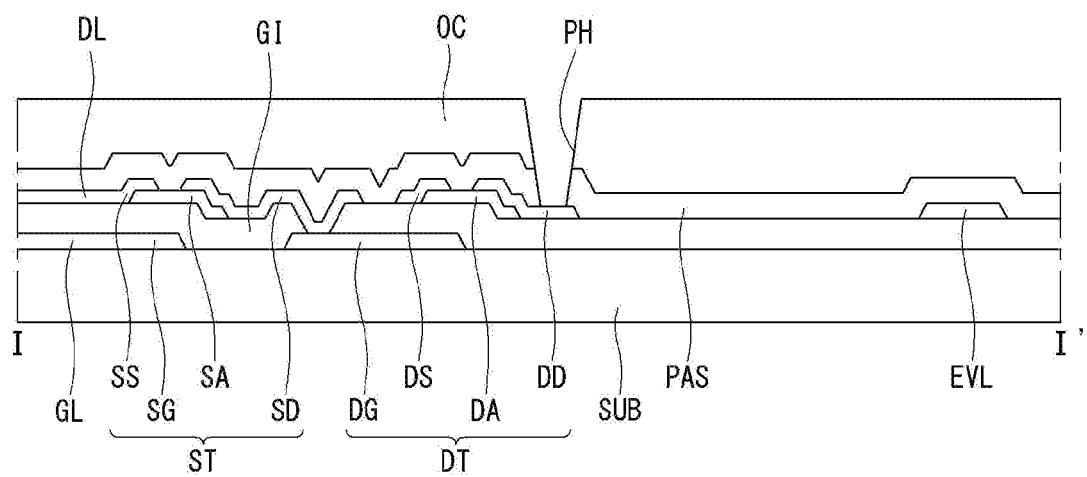

Referring to FIGS. 10A and 10B, an OLED display according to the present disclosure includes gate lines GL extended in a first direction and data lines DL1, DL2, DL3, DL4, DL5, and DL6 extended in a second direction. A first region R1, a second region R2, a third region R3, a fourth region R4, a fifth region R5, and a sixth region R6 may be defined by the intersection structures of the gate lines GL and the data lines DL1, DL2, DL3, DL4, DL5, and DL6. The first region R1, the second region R2, the third region R3, the fourth region R4, the fifth region R5, the sixth region R6 may be sequentially arranged alternately in the first direction.

A first transistor array TA1 is formed in the first region R1. A second transistor array TA2 is formed in the second region R2. A third transistor array TA3 is formed in the third region R3. A fourth transistor array TA4 is formed in the fourth region R4. A fifth transistor array TA5 is formed in the fifth region R5. A sixth transistor array TA6 is formed in the sixth region R6.

The first transistor array TA1 and the second transistor array TA2 have plane structures symmetrical to each other with respect to a first high potential power source line EVL1 extended in the second direction. The third transistor array TA3 and the fourth transistor array TA4 have plane structures symmetrical to each other with respect to a second high potential power source line EVL2 extended in the second direction. The fifth transistor array TA5 and the sixth transistor array TA6 have plane structures symmetrical to each other with respect to a third high potential power source line EVL3 extended in the second direction.

The first to sixth transistor arrays TA1, TA2, TA3, TA4, TA5, and TA6 include TFTs. Each of the TFTs may include a switching TFT ST and a driving TFT DT connected to the switching TFT ST. The transistor is illustrated as being a bottom gate type TFT, but is not limited thereto and may be implemented as various structures, such as a top gate type and a double gate type.

For example, a driving TFT DT connected to a switching TFT ST is formed on the substrate SUB of an organic light-emitting display. The switching TFT ST includes a switching gate electrode SG, a switching semiconductor layer SA, and switching source/drain electrodes SS and SD. The driving TFT DT includes a driving gate electrode DG, a driving semiconductor layer DA, and driving source/drain electrodes DS and DD.

More specifically, the switching gate electrode SG and the driving gate electrode DG are formed on the substrate SUB. A gate insulating film GI is formed on the gate electrodes SG and DG. The switching semiconductor layer SA overlapping at least part of the switching gate electrode SG and the driving semiconductor layer DA overlapping at least part of the driving gate electrode DG are formed on the gate insulating film GI.

The source electrode SS, DS and the drain electrode SD, DD spaced apart at a given interval are formed on the semiconductor layers SA and DA. One side of the switching semiconductor layer SA comes into contact with the switching source electrode SS, and the other side thereof comes into contact with the switching drain electrode SD. One side of the driving semiconductor layer DA comes into contact with the driving source electrode DS, and the other side thereof comes into contact with the driving drain electrode DD. The switching drain electrode SD and the driving gate electrode DG may be electrically connected.

A protection layer is formed on the source/drain electrodes SS, DS, SD, and DD. The protection layer may include at least one of a passivation film PAS made of an inorganic substance or a planarization film OC made of an organic substance. A pixel contact hole PH through which the driving drain electrode DD is exposed is formed in the protection layer.

Figure 11A:
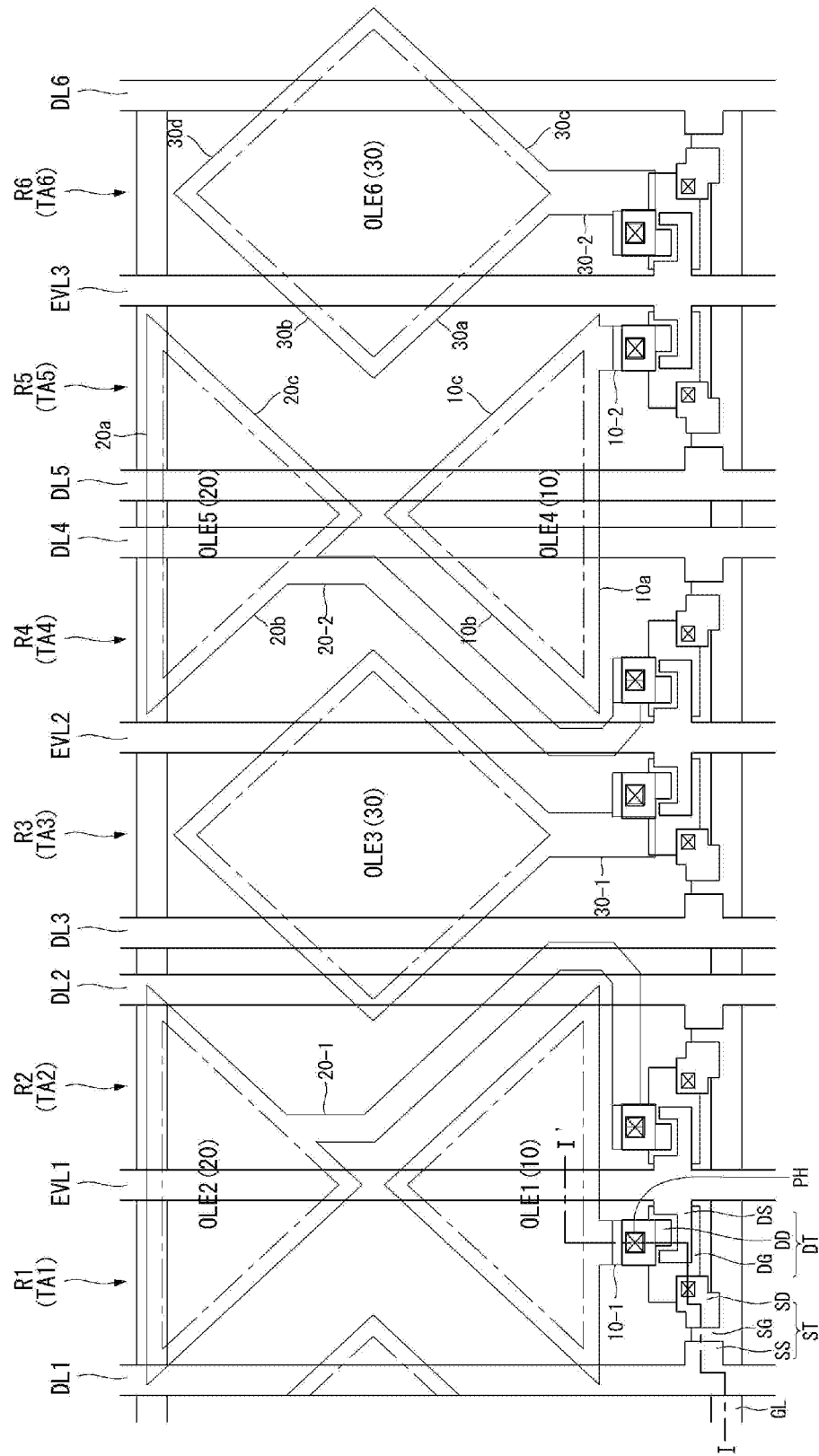
FIGS. 11A and 11B schematically show connection relations between transistor arrays and OLEDs according to an application example of the present disclosure.
Figure 11B:
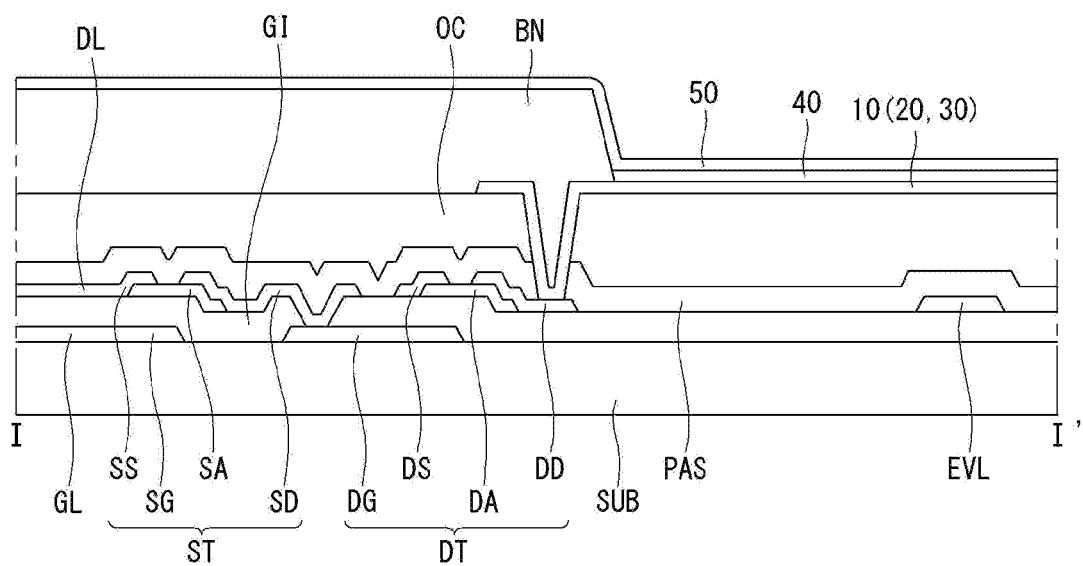
Figure 12:
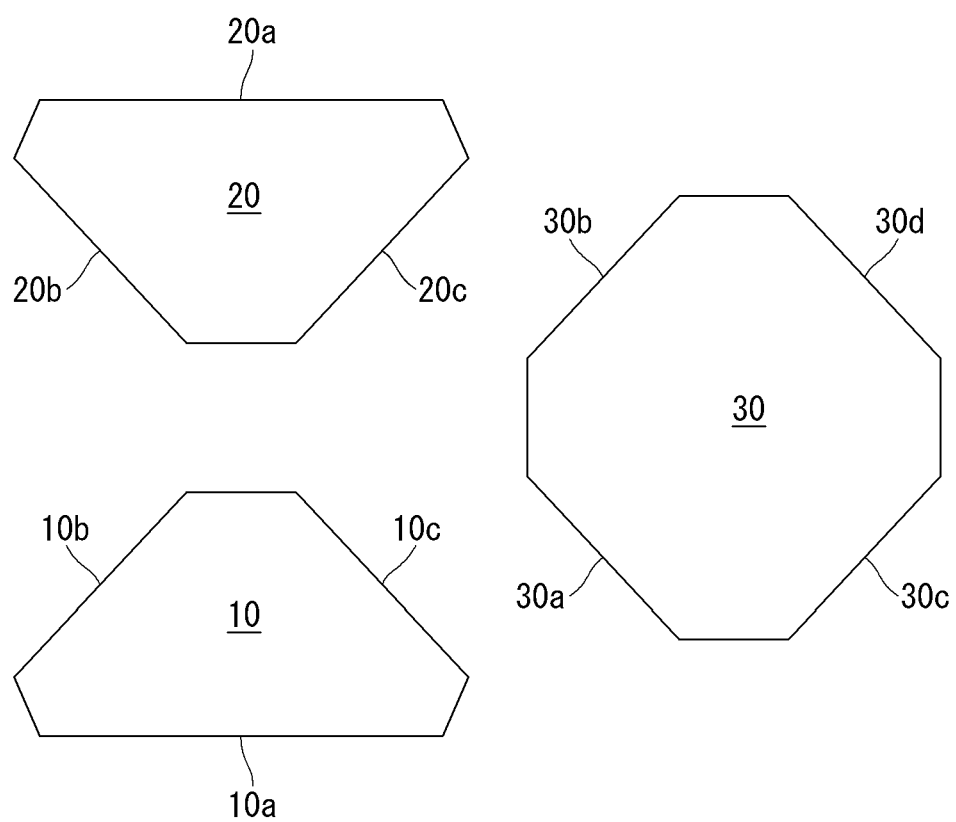
FIG. 12 illustrates a modified example of a first electrode.

Referring to FIGS. 11A and 11B, an OLED display according to an application example includes a first OLED OLE1, a second OLED OLE2, a third OLED OLE3, a fourth OLED OLE4, a fifth OLED OLE5, and a sixth OLED OLE6. The first and the fourth OLEDs OLE1 and OLE4 emit light of the first color. The second and the fifth OLEDs OLE2 and OLE5 emit light of the second color. The third and the sixth OLEDs OLE3 and OLE6 emit light of the third color.

Each of the OLEDs includes a first electrode 10, 20, 30, a second electrode 50, and an organic compound layer 40 interposed between the first electrode 10, 20, 30 and the second electrode 50. The first electrode 10, 20, 30 may be an anode, and the second electrode 50 may be a cathode.

More specifically, the first electrode 10, 20, 30 is formed on a protection layer. Each of the first electrodes 10, 20, and 30 is electrically connected to the driving drain electrode DD of a corresponding transistor array through a pixel contact hole that penetrates a protection layer.

The first electrode 10 of the first, fourth OLED OLE1, OLE4 emitting the first color may have a plane shape of a triangle having three sides. That is, the first electrode 10 of the first, fourth OLED OLE1, OLE4 may have a first side 10a parallel to the first direction, a second side 10b bent and extended from one end of the first side 10a, and a third side 10c bent and extended from the other end of the first side 10a and connected to the second side 10b. An angle formed by the first side 10a and the second side 10b and an angle formed by the first side 10a and the third side 10c may be the same.

The first electrode 20 of the second, fifth OLED OLE2, OLE5 emitting the light of the second color may have a plane shape of a triangle having three sides. That is, the first electrode 20 of the second, fifth OLED OLE2, OLE5 may have a fourth side 20a parallel to the first direction, a fifth side 20b bent and extended from one end of the fourth side 20a, and a sixth side 20c bent and extended from the other end of the fourth side 20a and connected to the fifth side 20b. An angle formed by the fourth side 20a and the fifth side 20b and an angle formed by the fourth side 20a and the sixth side 20c may be the same. The first electrode 20 of the second, fifth OLED OLE2, OLE5 may have a plane shape symmetrical to the plane shape of the first electrode 10 of the first, fourth OLED OLE1. OLE4 with respect to a virtual line extended in the first direction.

The first electrode 30 of the third, sixth OLED OLE3, OLE6 emitting the light of the third color may have a plane shape of a rectangle having four sides. That is, the first electrode 30 of the third, sixth OLED OLE3, OLE6 may have a seventh side 30a making an acute angle (θ) with a virtual line extended in the second direction, an eighth side 30b bent and extended from one end of the seventh side 30a and symmetrical to the seventh side 30a up and down with respect to an X axis (e.g., the eighth side 30b disposed symmetrical with the seventh side 30a), a ninth side 30c bent and extended from the other end of the seventh side 30a and being parallel to the eighth side 30b, and a tenth side 30d connected to the eighth side 30b and the ninth side and parallel to the seventh side 30a.

The seventh side 30a may be parallel to the third side 10c adjacent to the seventh side. The eighth side 30b may be parallel to the sixth side 20c adjacent to the eighth side. In this case, the third side 10c and the seventh side 30a are spaced apart, and the sixth side 20c and the eighth side 30b are spaced apart, and may have a minimum distance or a distance based on a process margin.

The first electrode 10 of the first OLED OLE1 may be widely formed on the first transistor array TA1 and the second transistor array TA2. The first electrode 10 of the first OLED OLE1 is connected to the drain electrode of the first transistor array TA1 through a first connection part 10-1. The first connection part 10-1 is a part extended from one side of the first electrode 10.

The first electrode 20 of the second OLED OLE2 may be widely formed on the first transistor array TA1 and the second transistor array TA2. The first electrode 20 of the second OLED OLE2 is connected to the drain electrode of the second transistor array TA2 through a second connection part 20-1. The second connection part 20-1 is a part extended from one side of the first electrode 20, and traverses the space between the first electrode 10 of the first OLED OLE1 and the first electrode 30 of the third OLED OLE3.

The first electrode 30 of the third OLED OLE3 may be widely formed on the second transistor array TA2, the third transistor array TA3, and the fourth transistor array TA4. The first electrode 30 of the third OLED OLE3 is connected to the drain electrode of the third transistor array TA3 through a third connection part 30-1. The third connection part 30-1 is a part extended from one side of the first electrode 30.

The first electrode 10 of the fourth OLED OLE4 may be widely formed on the fourth transistor array TA4 and the fifth transistor array TA5. The first electrode 10 of the fourth OLED OLE4 is connected to the drain electrode of the fifth transistor array TA5 through a fourth connection part 10-2. The fourth connection part 10-2 is a part extended from one side of the first electrode 10.

The first electrode 20 of the fifth OLED OLE5 may be widely formed on the fourth transistor array TA4 and the fifth transistor array TA5. The first electrode 20 of the fifth OLED OLE5 is connected to the drain electrode of the fourth transistor array TA4 through a fifth connection part 20-2. The fifth connection part 20-2 is a part extended from one side of the first electrode 20, and traverses the space between the first electrode 30 of the third OLED OLE3 and the first electrode 10 of the fourth OLED OLE4.

The first electrode 30 of the sixth OLED OLE6 may be widely formed on the fifth transistor array TA5, the sixth transistor array TA6, and the first transistor array TA1. The first electrode 30 of the sixth OLED OLE6 is connected to the drain electrode of the sixth transistor array TA6 through a sixth connection part 30-2. The sixth connection part 30-2 is a part extended from one side of the first electrode 30.

For another example, as shown in FIG. 12, the first electrode 10, 20, 30 may have a plane shape having at least one-side edge chamfered.

The first electrode of the first OLED OLE1 is electrically connected to the driving drain electrode of the first transistor array TA1 and is supplied with a driving signal. The first electrode of the second OLED OLE2 is electrically connected to the driving drain electrode of the second transistor array TA2 and is supplied with a driving signal. The first electrode of the third OLED OLE3 is electrically connected to the driving drain electrode of the third transistor array TA3 and is supplied with a driving signal. The first electrode of the fourth OLED OLE4 is electrically connected to the driving drain electrode of the fifth transistor array TA5 and is supplied with a driving signal. The first electrode of the fifth OLED OLE5 is electrically connected to the driving drain electrode of the fourth transistor array TA4 and is supplied with a driving signal. The first electrode of the sixth OLED OLE6 is electrically connected to the driving drain electrode of the sixth transistor array TA6 and is supplied with a driving signal.

A bank BN is formed on a substrate SUB in which the first electrode 10, 20, 30 have been formed. The bank BN includes openings through which at least a part of the first electrode 10, 20, 30 is exposed, and part of the first electrode 10, 20, 30 exposed by the openings may be defined as a light-emitting region.

An organic compound layer OL is formed on the first electrode 10, 20, 30. The organic compound layer OL includes an emission layer EML, and may further include any one or more of common layers, such as a hole injection layer HIL, a hole transport layer HTL, an electron transport layer ETL, and an electron injection layer EIL.

A second electrode 50 is formed on the organic compound layer OL. The second electrode 50 may be widely formed on the entire surface of the substrate SUB.

Those skilled in the art will understand that the present disclosure may be changed and modified in various ways without departing from the technical spirit of the present disclosure through the above-described contents.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An electroluminescence display, comprising:
   transistor arrays arranged in a first direction and a second direction intersecting the first direction;
   organic light-emitting diodes (OLEDs) electrically connected to the transistor arrays to emit light of a first color, a second color, and a third color; and
   power source lines to apply power source voltages to the transistor arrays,
   wherein the transistor arrays are disposed adjacently in the first direction and share one power source line positioned between the transistor arrays, and
   wherein the transistor arrays include a transistor array of an A type and a transistor array of a B type symmetrical to each other with reference to a reference line extended in the second direction,
   wherein the OLEDs are arranged in an order of a first OLED of the first color, a second OLED of the second color, a third OLED of the third color, a fourth OLED of the first color, a fifth OLED of the second color, and a sixth OLED of the third color, and
   wherein the transistor arrays are arranged in an order of a first transistor array of the A type, a second transistor array of the B type, a third transistor array of the A type, a fourth transistor array of the B type, a fifth transistor array of the A type, and a sixth transistor array of the B type in the first direction,
   wherein the first OLED is electrically connected to the first transistor array, the second OLED is electrically connected to the second transistor array, and the third OLED is electrically connected to the third transistor array; and
   wherein the fourth OLED is electrically connected to the fifth transistor array, the fifth OLED is electrically connected to the fourth transistor array, and the sixth OLED is electrically connected to the sixth transistor array; or
   wherein the fourth OLED is electrically connected to the fourth transistor array, the fifth OLED is electrically connected to the sixth transistor array, and the sixth OLED is electrically connected to the fifth transistor array.

2. The electroluminescence display of claim 1, wherein:
   the first transistor array is supplied with a first data voltage of the first color and turns on the first OLED electrically connected to the first transistor array;
   the second transistor array is supplied with a second data voltage of the second color and turns on the second OLED electrically connected to the second transistor array;
   the third transistor array is supplied with a third data voltage of the third color and turns on the third OLED electrically connected to the third transistor array;
   the fourth transistor array is supplied with a fourth data voltage of the second color and turns on the fifth OLED electrically connected to the fourth transistor array;
   the fifth transistor array is supplied with a fifth data voltage of the first color and turns on the fourth OLED electrically connected to the fifth transistor array; and
   the sixth transistor array is supplied with a sixth data voltage of the third color and turns on the sixth OLED electrically connected to the sixth transistor array.

3. The electroluminescence display of claim 1, wherein:
   the first color is any one of red or green,
   the second color is a different one of red or green, and
   the third color is blue.

4. The electroluminescence display of claim 1, wherein:
   the first transistor array is supplied with a first data voltage of the first color and turns on the first OLED electrically connected to the first transistor array;
   the second transistor array is supplied with a second data voltage of the second color and turns on the second OLED electrically connected to the second transistor array;
   the third transistor array is supplied with a third data voltage of the third color and turns on the third OLED electrically connected to the third transistor array;
   the fourth transistor array is supplied with a fourth data voltage of the first color and turns on the fourth OLED electrically connected to the fourth transistor array;
   the fifth transistor array is supplied with a fifth data voltage of the third color and turns on the sixth OLED electrically connected to the fifth transistor array; and
   the sixth transistor array is supplied with a sixth data voltage of the second color and turns on the fifth OLED electrically connected to the sixth transistor array.

5. The electroluminescence display of claim 1, wherein:
   the first color is blue;
   the second color is any one of red or green, and
   the third color is a different one of red or green.

6. The electroluminescence display of claim 1, wherein:
   the OLEDs include a first electrode, a second electrode, and an organic compound layer disposed between the first electrode and the second electrode;
   the first electrode of each of the first OLED and the fourth OLED has a triangular shape;
   the first electrode of each of the second OLED and the fifth OLED has a triangular shape
   the first electrode of each of the third OLED and the sixth OLED has a rectangular shape;

each of the first electrode of the first OLED and the first electrode of the second OLED has a plane shape that is symmetrical to each other with respect to a reference line extended in the first direction; and
each of the first electrode of the fourth OLED and the first electrode of the fifth OLED has a plane shape that is symmetrical to each other with respect to the reference line.

7. The electroluminescence display of claim 6, wherein:
a plane shape of the first electrode of each of the first OLED and the fourth OLED has a first side parallel to the first direction, a second side bent and extended from one end of the first side, and a third side bent and extended from another end of the first side and connected to the second side;
a plane shape of the first electrode of each of the second OLED and the fifth OLED has a fourth side parallel to the first direction, a fifth side bent and extended from one end of the fourth side, and a sixth side bent and extended from another end of the fourth side and connected to the fifth side; and
a plane shape of the first electrode of each of the third OLED and the sixth OLED has a seventh side forming an acute angle with a virtual line extended in the second direction, an eighth side bent and extended from one end of the seventh side and symmetrical to the seventh side up and down with respect to a virtual line extended in the first direction, a ninth side bent and extended from another end of the seventh side and parallel to the eighth side, and a tenth side connected to the eighth side and the ninth side and parallel to the seventh side.

8. The electroluminescence display of claim 7, wherein:
the third side and the seventh side are disposed in parallel; and
the sixth side and the eighth side are disposed in parallel.

9. The electroluminescence display of claim 6, wherein:
the first electrode of the first OLED is formed on the first transistor array and the second transistor array;
the first electrode of the second OLED is formed on the first transistor array and the second transistor array;
the first electrode of the third OLED is formed on the second transistor array, the third transistor array, and the fourth transistor array;
the first electrode of the fourth OLED is formed on the fourth transistor array and the fifth transistor array;
the first electrode of the fifth OLED is formed on the fourth transistor array and the fifth transistor array; and
the first electrode of the sixth OLED is formed on the fifth transistor array, the sixth transistor array, and the first transistor array.

10. The electroluminescence display of claim 6, wherein:
the first electrode of the first OLED is connected to the first transistor array through a first connection part;
the first electrode of the second OLED is connected to the second transistor array through a second connection part;
the first electrode of the third OLED is connected to the third transistor array through a third connection part;
the first electrode of the fourth OLED is connected to the fifth transistor array through a fourth connection part;
the first electrode of the fifth OLED is connected to the fourth transistor array through a fifth connection part;
the first electrode of the sixth OLED is connected to the first transistor array through a sixth connection part;
the second connection part is extended between the first electrode of the first OLED and the first electrode of the third OLED; and
the fifth connection part is extended between the first electrode of the third OLED and the first electrode of the fourth OLED.

11. The electroluminescence display of claim 6, wherein at least one of the first electrodes has a shape with at least one chamfered side edge.

12. The electroluminescence display of claim 1, wherein the transistor arrays of A type are adjacent to one side of the reference line, respectively; and
wherein the transistor arrays of B type are adjacent to the other side of the reference line, respectively.

13. An electroluminescence display, comprising:
transistor arrays arranged in a first direction and a second direction intersecting the first direction;
organic light-emitting diodes (OLEDs) electrically connected to the transistor arrays to emit light of a first color, a second color, and a third color; and
power source lines to apply power source voltages to the transistor arrays,
wherein the transistor arrays are disposed adjacently in the first direction and share one power source line positioned between the transistor arrays, and
wherein the transistor arrays include a transistor array of an A type and a transistor array of a B type symmetrical to each other with reference to a reference line extended in the second direction,
wherein the OLEDs electrically connected to the transistor array of the A type emit one of the first color, the second color, or the third color,
wherein the OLEDs electrically connected to the transistor array of the B type emit one of the first color, the second color, or the third color that is different from the color emitted by the OLEDs connected to the transistor array of the A type,
wherein the OLEDs are arranged in an order of a first OLED of the first color, a second OLED of the second color, a third OLED of the third color, a fourth OLED of the first color, a fifth OLED of the second color, and a sixth OLED of the third color,
wherein the transistor arrays are arranged in an order of a first transistor array of the A type, a second transistor array of the B type, a third transistor array of the A type, a fourth transistor array of the B type, a fifth transistor array of the A type, and a sixth transistor array of the B type in the first direction, and
wherein:
the OLEDs include a first electrode, a second electrode, and an organic compound layer disposed between the first electrode and the second electrode;
the first electrode of each of the first OLED and the fourth OLED has a triangular shape;
the first electrode of each of the second OLED and the fifth OLED has a triangular shape;
the first electrode of each of the third OLED and the sixth OLED has a rectangular shape;
each of the first electrode of the first OLED and the first electrode of the second OLED has a plane shape that is symmetrical to each other with respect to a reference line extended in the first direction; and
each of the first electrode of the fourth OLED and the first electrode of the fifth OLED has a plane shape that is symmetrical to each other with respect to the reference line.

14. The electroluminescence display of claim 13, wherein the first OLED is electrically connected to the first transistor array, the second OLED is electrically connected to the second transistor array, and the third OLED is electrically connected to the third transistor array; and wherein the fourth OLED is electrically connected to the fifth transistor array, the fifth OLED is electrically connected to the fourth transistor array, and the sixth OLED is electrically connected to the sixth transistor array.

15. The electroluminescence display of claim 13, wherein the first OLED is electrically connected to the first transistor array, the second OLED is electrically connected to the second transistor array, and the third OLED is electrically connected to the third transistor array; and wherein the fourth OLED is electrically connected to the fourth transistor array, the fifth OLED is electrically connected to the sixth transistor array, and the sixth OLED is electrically connected to the fifth transistor array.

* * * * *